United States Patent [19]
Yamamoto et al.

[11] Patent Number: 5,202,308
[45] Date of Patent: * Apr. 13, 1993

[54] FABRICATION OF SINTERED OXIDE SUPERCONDUCTING WIRES

[75] Inventors: Susumu Yamamoto; Nozomu Kawabe; Teruyuki Murai, all of Itami, Japan

[73] Assignee: Sumitomo Electric Industries, Ltd., Osaka, Japan

[ * ] Notice: The portion of the term of this patent subsequent to Mar. 31, 2009 has been disclaimed.

[21] Appl. No.: 806,996

[22] Filed: Dec. 13, 1991

Related U.S. Application Data

[60] Division of Ser. No. 438,986, Nov. 20, 1989, Pat. No. 5,100,865, which is a continuation of Ser. No. 180,494, Apr. 12, 1988, abandoned.

[30] Foreign Application Priority Data

Apr. 17, 1987 [JP] Japan ................................. 62-96044

[51] Int. Cl.$^5$ ......................... H01B 5/02; H01L 39/24
[52] U.S. Cl. ......................................... 505/1; 505/704; 427/62; 29/599; 174/125.1; 419/20; 419/22
[58] Field of Search ....................... 505/1, 704; 427/62; 29/599, 33 D; 174/125.1; 419/20, 22, 19

[56] References Cited

U.S. PATENT DOCUMENTS 4,906,609  3/1990  Yamauchi et al. ....................... 505/1
5,100,865  3/1992  Yamamoto et al. ..................... 505/1

OTHER PUBLICATIONS

Yamada et al, "Critical Current Density of Wire Type Y-Ba-Cu Oxide Superconductor," Jpn. J. Appl. Phys. 26(5) May 1987 L865-866.
Kohno et al, "Critical Temperature and Critical Current density of La-Sr-Cu Oxide Wires," Jpn. J. Appl. Phys. 26(5) May 1987 L759-760.

*Primary Examiner*—Shrive Beck
*Assistant Examiner*—Roy V. King
*Attorney, Agent, or Firm*—Pennie & Edmonds

[57] ABSTRACT

The present invention relates to a sintered ceramic superconducting wire which is made by placing powders of metal oxides or a mixture of powders of metal oxides and metal carbonates, said oxides and said carbonates each having an oxidation potential higher than or equal to that of copper, in a metallic cylinder formed from a high temperature oxidation-resistant material, and drawing the packed cylinder to a final size and sintering said drawn packed cylinder in air, wherein said cylinder is removed prior or subsequent to the final step of sintering.

17 Claims, No Drawings

FABRICATION OF SINTERED OXIDE SUPERCONDUCTING WIRES

This is a division of application Ser. No. 07/438,986, filed Nov. 20, 1989, now U.S. Pat. No. 5,100,865, which is a continuation of U.S. application Ser. No. 180,494, filed Apr. 12, 1988, now abandoned.

DETAILED DESCRIPTION OF THE INVENTION

1. Field of the Invention

The present invention relates to a sintered wire.

2. Prior Art

Recently, ceramics materials, such as AlN, $Si_3N_4$ and $Al_2O_3$, have been used in various kinds of use due to their various kinds of superior characteristic including the heat-resistance.

In addition, sintered ceramics materials, such as La-Sr-Cu-O materials and La-Ba-Cu-O materials, have been watched with interest as superconducting materials having high critical temperatures and have been rapidly developed.

However, in the case where these sintered ceramics materials are practically used, it is required to form them in the form of thin wire according to circumstances.

In general, wire-like ceramics have been difficult to produce and have been produced merely by a method, in which ceramics raw material powders are blended with suitable organic adhesives and then the resulting blend is extruded in the form of thin rod, and a method, in which the blend is extruded in the form of square lumber and then ground to turn into a thin rod followed by intermediately sintering the molded product to remove the organic adhesives and additionally sintering.

However, the method, in which the blend is extruded in the form of square lumber and then ground to turn into a thin rod followed by sintering, has exhibited disadvantages in that the available efficiency of the expensive ceramics raw material powders is low; a size in the longitudinal direction of the thin rod sufficiently long relatively to that in the sectional direction thereof can not be taken due to the grinding process conducted; the productivity is low due to the grinding process required; and the like.

On the other hand, the method, in which the blend is extruded in the form of thin rod and then sintered, has exhibited advantages in that the available efficiency of the ceramics raw material powders is high; also the productivity is high; and the like but has exhibited disadvantages in that in order to conduct the extrusion molding, a remarkably large amount of organic adhesives must be added to the raw material powders, whereby the adhesives are difficult to completely remove during the intermediate sintering process and as a result, the adhesives leaving until the sintering process leads to the generation of defects to lower the strength and toughness of the resulting ceramics sintered body. However, in order to obtain the reliability as the structure having the superconductance, the sufficient strength and toughness are required so that the structure may not be broken during the use thereof.

In addition, it has been difficult to form the size of the thin rod in the longitudinal direction sufficient long in comparison with that in the sectional direction thereof also by this method.

Problems to be Solved by the Invention

As above described, the conventional methods of producing a ceramics wire have been difficult to say that they are effective measures which can be immediately applied to the production of a thin and long ceramics wire having the sufficient strength and toughness so as to avoid the breakage and the like.

Measures for Solving the Problems

A sintered wire according to the present invention is characterized by that raw material powders are charged in a metallic cylinder formed of high temperature oxidation-resisting materials and said cylinder is subjected to the drawing process followed by sintering said raw material powders when the wire is produced with a powdery mixture comprising powders of oxides of metals having an oxygen potential ($\Delta G$) of the formation of oxide same as or higher than that of copper at normal temperature or more as the raw material powders, preferably that the metallic cylinder filled with the raw material powders is repeatedly subjected to the drawing process, intermediate sintering process and additional sintering process in case of need.

Operation

It is an object of the present invention to fill the metallic cylinder formed of high temperature oxidation-resisting materials with powders comprising powders of oxides of metals having an oxygine potential ($\Delta G°$) of the formation of oxide same as or higher than that of copper at normal temperature or more to produce a wire material. Thus, the reduction of the raw material powders by the cylinder materials can be suppressed as far as possible, whereby a superior sintered wire can be obtained.

A sintered ceramics wire obtained according to the present invention comprises a thin metallic coating around an outside circumference thereof but this metallic coating may be removed later or the coating may be left according to kinds of metals to use the sintered ceramics wire as a composite material.

In addition, in the present invention the intermediate sintering process and the drawing process may be carried out and then the metallic cylinder may be removed followed by sintering the ceramics powders. The reason of this is that since the sintering temperature of the ceramics powders is high, the reaction between the metallic cylinder and the metals must be prevented from occurring.

In addition, after the above described intermediate sintering process and drawing process an intermediate baking may be carried out followed by removing the metallic cylinder and subsequently the ceramics powders may be sindered. It is the reason why the intermediate baking is carried out after the intermediate sintering process and drawing process that the strength is given to hold a desired form for putting in the sintering furnace by carrying out the intermediate baking when subsequently the metallic cylinder is removed to sinter the ceramics powders.

In addition, it is the reason why the metallic cylinder is removed after the sintering process that the absence of the metallic cylinder is better for the case where the original characteristics of the ceramics (for example corrosion-resistance and abrasion-resistance) are required.

The darwing process in the present invention may be carried out by any one of a die drawing, roller die drawing, rolling roll drawing, swaging and extrusion drawing.

In the case where the bulk density of the ceramics raw material powders to be charged in the metallic cylinder is low and thus difficult to sufficiently charge in the metallic cylinder, the raw material powders become easy to charge and thus the high packing density is obtained by previously subjecting the ceramics raw material powders to the granulating process to turn into granulations.

According to the present invention, the ceramics raw material powders can be subjected to the drawing process even though the organic adhesives are not added thereto and the intermediate sintering process is conducted at temperatures, at which the cylinder is sintered but the ceramics powders are not sintered, after the drawing process and then the additional drawing process is conducted followed by sintering the ceramics powders. Thus, the drawing degree can be increased to obtain the ceramics wire having a small diameter and an increased strength and without showing the breakage.

The intermediate sintering process at temperatures, at which the metallic cylinder is sintered but the ceramics powders are not sintered, conducted after the drawing process according to the present invention may be suitably selected depending upon metals or alloys forming the cylinder or the composition of the ceramics powders.

In addition, the sintering process may be conducted at temperatures depending upon the composition of the ceramics raw material powders.

According to the present invention, the size of the sintered ceramics wire can be optionally selected and the size in the longitudinal direction 30 times or more that in the sectional direction can be attained.

The present invention exhibits an advantage also in a high available coefficient of the ceramics raw material powders comprising expensive ingredients and the like.

The metallic elements having an oxygen potential higher than that of copper according to the present invention includes Os, Ir, Al, Ag, Au, Pt, K, Rh, Mo, Se, Na and the like and oxides of said metallic elements include $OsO_4$, $IrO_2$, $AlO_2$, $AgO$, $AuO$, $PtO$, $KO_2$, $RhO$, $Rh_2O_3$, $MoO_2$, $SeO_2$, $SeO$, $NaO_2$ and the like.

In addition, Ni-base alloys include Ni-Cr-Fe, Ni-Mo-Cr-Fe, Ni-Cr-Mo-W-Fe, Ni-Cr-Mn-Fe and the like.

The sintered wire according to the present invention can be applied in particular to a sintered ceramics wire formed of perovuskite type or pseudo-perovuskite type oxides, such as Ba-Y-Cu-O series, La-Sr-Cu-O series and Ba-La-Cu-O series.

Preferred Embodiments

The present invention will be below in more detail described with reference to the preferred embodiments.

EXAMPLE 1

A cylinder formed of iron having an outside diameter of 5 mm, inside diameter of 4 mm and length of 1 m was filled with $Ag_2O$ powders on the market and closed at both ends thereof and then subjected to the drawing process until a diameter of 2.5 mm followed by sintering at 900° C. for 2 hours in air. An outside layer formed of sintered $Ag_2O$ having a diameter of 2.0 mm (of 0.7 mm thick) was almost completely reduced to pure Ag and only $Ag_2O$ having a diameter of 0.6 mm was left in the central portion.

Next, the same treatment as in the above described was conducted using a pipe formed of Inconel 601 having the same form. The reduced layer of the $Ag_2O$ sintered body was of 0.08 mm thick. That is, the product was almost completely formed of $Ag_2O$ sintered body.

EXAMPLE 2

$Y_2O_3$ powders of 20.0 % by weight, $BaCO_3$ powders of 54.7 % by weight and CuO powders of 24.5 % by weight on the market were subjected to a wet blending and then dried. The dried powders were molded by pressing at a pressure of 100 kg/cm$^2$ and then baked at 880° C. for 24 hours in air followed by pulverizing to 100 meshes or less. This process including the press molding step, baking step, pulverizing step and screening step was repeated 3 times.

A cylinder formed of copper having an outside diameter of 5 mm, inside diameter of 4 mm and length of 1 m was filled with the raw material powders particulated in the above described manner and closed at both ends thereof.

The cylinder filled with the raw material powders was subjected to the drawing process until an outside diameter of 1.2 mm followed by sintering at 930° C. for 3 hours. As a result, the sintered ceramics wire having a length of 7.7 m clad with a copper layer having a thickness of 0.2 mm was obtained.

Originally, this ceramics wire ought to be perovuskite showing the superconductance but it did not show the superconducting characteristics at all.

This sintered ceramics wire was colored in red also visually, that is, it was presumed that CuO was reduced to Cu but also the X-ray analysis did not show the peaks of perovuskite but the peaks of Cu and CuO and the like were observed.

Successively, a cylinder formed of stainless steel 304 was filled with said powders and subjected to the similar treatment to obtain the sintered ceramics wire having the critical temperature (Tc) of 68° K. The sintered body was colored in bright green excluding an extreme surface thereof and also the X-ray diffraction showed the same peaks as those of perovuskite produced by the press-sintering method and showing the critical temperature of 70° K.

EXAMPLE 3

$La_2O_3$ powders of 85.5 % by weight, $SrCO_3$ powders of 3.1% by weight and CuO powders of 11.4 % by weight on the market were subjected to a wet blending and then dried. The powdery mixture was molded by pressing at a pressure of 100 kg/cm$^2$ and then baked at 900° C. for 20 hours in air followed by pulverizing to 100 meshes or less.

A cylinder formed of stainless steel sus 310 having an outside diameter of 5 mm, inside diameter of 4 mm and length of 1 m was filled with this particulated raw material powders and closed at both ends thereof.

The cylinder filled with the above described raw material powders was subjected to the drawing process until an outside diameter of 1.8 mm followed by sintering at 1,050° C. for 2 hours in air. As a result, the sintered ceramics superconducting wire having a length of 7.7 m clad with a copper layer having a thickness of 0.2 mm was obtained.

This sintered ceramics superconducting wire showed the critical temperature of superconductance of 37° K. and the yield strength of 26.2 kg/mm².

On the other hand, the treatment was carried out in the same manner excepting that a cylinder formed of iron is used. The reduced layer having a thickness of about 0.2 mm from the surface was observed but the resulting sintered ceramics superconducting wire showed the critical temperature of superconductance of 34.2° K.

It can be estimated that the non-reduced central portion shows the superconducting characteristics but the critical temperature was lowered in comparison with that in the case where the cylinder formed of stainless steel sus 310 was used.

In addition, the yield strength was almost same, that is, 27.0 kg/mm².

Effects of the Invention

As above described, according to the present invention, it was found that the reduction-preventing effect contributed to the resulting sintered wire in particular greatly in the case where ceramics having superconducting characteristics, in particular perovuskite type or pseudo-perovuskite type oxides, were used.

What is claimed is:

1. A method of making a sintered wire of a ceramic copper oxide superconductive material, comprising the steps of:

packing powders of metal oxides or a mixture of powders of metal oxides and metal carbonates, which, when sintered, form the ceramic copper oxide superconductive material, said oxides and said carbonates each having an oxidation potential ($\Delta G°$) higher than or equal to that of copper, in a metallic cylinder formed from a high-pressure oxidation-resistant material, which high-temperature oxidation-resistant material does not react with said powders of metal oxides and metal carbonates, with the proviso that said high-temperature oxidation-resistant material is not selected from the group consisting of high-temperature oxidation-resistant stainless steel and high-temperature oxidation-resistant nickel alloy;

drawing said packed cylinder, and sintering said drawn packed cylinder in air to form said wire;

wherein said cylinder is removed prior to the final step of sintering.

2. The method of claim 1, comprising the further step of performing an intermediate heat treatment at a temperature at which the metallic cylinder is annealed.

3. The method of claim 2, wherein several such intermediate heat treatments are performed.

4. The method of claim 3, wherein said powders are sintered during said intermediate heat treatment.

5. The method of claim 1, wherein the drawing step is carried out using die drawing, rolling, swaging and/or extrusion.

6. The method of claim 1, comprising the further step of particulating said powders prior to said packing step.

7. The method of claim 1, wherein said superconductive material is of perovskite or pseudo-perovskite structure.

8. The method of claim 1, wherein said superconductive material is selected from the group consisting of Ba-Y-Cu-O, La-Sr-Cu-O, and Ba-La-Cu-O.

9. A method of making a sintered wire of a ceramic copper oxide superconductive material, comprising the steps of:

packing powders of metal oxides or a mixture of powders of metal oxides and metal carbonates which, when sintered, form the ceramic copper oxide superconductive material, said oxides and said carbonates each having an oxidation potential ($\Delta G°$) higher than or equal to that of copper, in a metallic cylinder formed from a high-temperature oxidation-resistant material, which high-temperature oxidation-resistant material does not react with said powders of metal oxides and metal carbonates, with the proviso that said high-temperature oxidation-resistant material is not selected from the group consisting of high-temperature oxidation-resistant stainless steel and high-temperature oxidation-resistant nickel alloy;

drawing said packed cylinder; and sintering said drawn packed cylinder in air to form said wire, wherein said cylinder is removed subsequent to the final step of sintering.

10. The method of claim 9, comprising the further step of performing an intermediate heat treatment at a temperature at which the metallic cylinder is annealed.

11. The method of claim 10, wherein several such intermediate heat treatments are performed.

12. The method of claim 11, wherein said powders are sintered during said intermediate heat treatment.

13. The method of claim 9, wherein the drawing step is carried out using die drawing, rolling, swaging and/or extrusion.

14. The method of claim 9, comprising the further step of particulating said powders prior to said packing step.

15. The method of claim 9, wherein said superconductive material is comprised of pervoskite or pseudo-perovskite structure.

16. The method of claim 9, wherein said superconductive material is selected from the group consisting of Ba-Y-Cu-O, La-Sr-Cu-O, and Ba-La-Cu-O.

17. A product by the process of any one of claims 1–16.

* * * * *